United States Patent
Boyko et al.

(10) Patent No.: US 7,242,230 B2
(45) Date of Patent: Jul. 10, 2007

(54) MICROPROCESSOR WITH POWER SAVING CLOCK

(75) Inventors: Daniel Boyko, Norwood, MA (US); James F. Potts, Wellesley, MA (US)

(73) Assignee: Analog Devices, Inc., Norwood, MA (US)

( * ) Notice: Subject to any disclaimer, the term of this patent is extended or adjusted under 35 U.S.C. 154(b) by 127 days.

(21) Appl. No.: 10/787,029

(22) Filed: Feb. 25, 2004

(65) Prior Publication Data

US 2005/0184773 A1   Aug. 25, 2005

(51) Int. Cl.
*H03L 7/06* (2006.01)
(52) U.S. Cl. ...................... 327/156; 327/147
(58) Field of Classification Search ............. 327/156, 327/147, 150–151, 159–160, 113–115, 117
See application file for complete search history.

(56) References Cited

U.S. PATENT DOCUMENTS

| | | | |
|---|---|---|---|
| 5,140,284 A * | 8/1992 | Petersson et al. | 331/25 |
| 5,764,711 A * | 6/1998 | Jokura | 375/376 |
| 5,774,511 A * | 6/1998 | Boerstler | 375/376 |
| 6,522,183 B2 * | 2/2003 | Sumi | 375/376 |
| 6,614,320 B1 * | 9/2003 | Sullam et al. | 331/46 |
| 6,675,249 B2 * | 1/2004 | Shimoda et al. | 710/305 |
| 6,687,320 B1 * | 2/2004 | Chiu et al. | 375/376 |

* cited by examiner

*Primary Examiner*—Timothy P. Callahan
*Assistant Examiner*—Cassandra Cox
(74) *Attorney, Agent, or Firm*—Wolf, Greenfield & Sacks, P.C.

(57) ABSTRACT

A data processing chip with a flexible timing system and method for supplying clocks to a digital data processing system useful for power conservation. A phase locked loop generates a master clock from which a core clock and a system clock are derived. The frequency of each of the core and system clocks is independently controllable relative to the master clock and can be changed on the fly with glitch free and jitter free operation. The data processing chip is well suited for use in hand held electronic devices where power management is a concern. Power can be saved by lowering the frequency of the core clock, even for short intervals of time.

23 Claims, 5 Drawing Sheets

MICROPROCESSOR WITH POWER SAVING CLOCK

BACKGROUND OF INVENTION

1. Field of Invention

This invention relates generally to computer data processors and more specifically to clock or timing circuitry of such processors.

2. Discussion of Related Art

Computer data processors are widely used in modern electronic systems. For example, most desktop computers are built around a microprocessor chip. The microprocessor chip is a computer data processor that can be programmed to perform many data processing functions. Microprocessors perform arithmetic operations or logical operations which can be combined into many types of programs, such as those used to do accounting or word processing.

Other computer data processors are designed for specialized functions. One example is a digital signal processor (DSP). A digital signal processor is conceptually similar to a general purpose microprocessor. However, a digital signal processor is configured to quickly perform complex mathematical operations used in processing of digital signals.

One important use of computer data processors is implementing the signal processing and control functions of cellular telephones and other portable electronic devices. Fast computation is important in these applications. Moreover, because these data processors are used in devices that derive power from a battery, it is desirable for the data processors to use as little power as possible.

FIG. 1 shows a high level a block diagram of a computer data processor chip 100. FIG. 1 could represent a general purpose computer data processor or it could represent a special purpose data processor, such as a digital signal processor. Within processor chip 100 is a microprocessor core 110. In operation, microprocessor core 110 reads instructions from memory 112 and then performs functions dictated by the instruction. In many cases, these instructions operate on data that is also stored. When an operation performed by microprocessor core 110 manipulates data, the data is read from memory (e.g., memories 116 and 150) and new data is generally stored in memory after the instruction is executed.

FIG. 1 shows that processor chip 100 includes an on-chip instruction memory unit 112 and an on-chip data memory unit 116. Both the instruction memory unit 112 and data memory unit 116 are controlled by a memory management unit (MMU) 114. Instruction memory unit 112 and data memory unit 116 each contain memory that stores information accessed by microprocessor core 110 as instructions or data, respectively.

However, it is generally impossible to build a processor chip with enough on-chip memory to store all the instructions or all the data needed to run a complex program because of lack of sufficient area. Therefore, integrated circuit 100 includes a memory interface 122 that can read or write instructions or data in off-chip memory 150.

Memory 150 could, for example, be DRAM semiconductor memory located on a printed circuit board on which processor chip 100 also is located. However, memory 150 need not be semiconductor memory. Off-chip memory 150 could be an optical or magnetic disk drive or even a magnetic tape, or some combination of storage elements. Regardless of the specific types of memory used to implement off-chip memory 150, it is likely that access time for the off-chip memory and other peripherals is longer than the access time for on-chip memory.

Processor chip 100 also contains interface circuitry that can interface to other off-chip devices. For example, serial interface 134 is shown. Serial interface 134 communicates with microprocessor core 110 via internal bus interface circuitry 130 and internal bus 138. In many cases, the off-chip devices operate at a lower frequency than microprocessor core 110 and other circuitry on processor chip 100.

It is traditional for a processor chip to contain a clock generator 160 that generates at least two clocks, which we call a CCLK and an SCLK. The CCLK signal is at a higher frequency than the SCLK signal. The CCLK signal provides timing to circuitry in the microprocessor core and related circuitry on the integrated circuit 100 that runs at the same clock rate as the core. In contrast, the SCLK signal is used to clock circuitry that interfaces to external memory and other circuitry that runs at a slower rate.

Traditionally, the CCLK and SCLK signals are synchronized so that circuitry clocked by the CCLK signal can communicate with circuitry clocked by the SCLK signal. Synchronization is achieved by having the SCLK signal derived from the CCLK signal. For example, a clock divider has been used to generate the SCLK from the CCLK signals.

We have recognized that prior art clock generation circuitry could be improved by providing greater flexibility in setting the frequencies of the SCLK and CCLK signals. We have recognized it would also be desirable to have a timing system in which the frequency of either clock might be changed on the fly with no jitter or spurious pulses.

SUMMARY OF INVENTION

A clock generation circuit is described that derives two separate clocks from a common clock, with independently controllable dividers.

In one embodiment, the clock rate of either clock can be changed "on the fly." In one aspect, the clocks can be re-synchronized quickly after the clock rate of either clock is adjusted, allowing the timing circuit to be used in a processor chip in which the clock rate can be lowered in a power saving mode. The circuitry is well suited for use in processors for cell phones and other personal electronic devices where power management is desired.

In one aspect, the invention relates to a device having a clock generation circuit which produces a first clock signal for use in timing internal circuitry and a second clock timing circuitry that interfaces to external circuitry. The clock generation circuit comprises a phase locked loop having an output; a first programmable frequency scaling circuit having an input coupled to the output of the phase locked loop, with an output of the first programmable divider providing the first clock signal; and a second programmable frequency scaling circuit having an input coupled to the output of the phase locked loop, an output of the second programmable divider supplying the second clock signal.

In another aspect, the device has digital logic receiving as a clock input the first clock; and interface logic, interfacing to the digital logic components external to the device and receiving as a clock input the second clock signal.

In another aspect, the device is a semiconductor chip and the semiconductor chip additionally has at least one control register with fields specifying the scale factor of the first frequency scaling circuit and the second frequency scaling circuit.

In another aspect, the invention relates to a method of operating a data processing chip having first circuitry and circuitry that interfaces to devices external to the data processing chip. The method comprises providing a reference clock; specifying a first frequency ratio between the first clock and the reference clock; deriving a first clock from the reference clock with the first frequency ratio; specifying a second frequency ratio between the second clock and the reference clock, the second frequency ratio specified independent of the first frequency ratio; deriving a second clock from the reference clock with the second frequency ratio; and clocking circuitry within the first circuitry using the first clock and clocking circuitry that interfaces to devices external to the core circuitry with the second clock.

In yet another aspect, the invention relates to a method of operating a data processing chip having first circuitry and circuitry that interfaces to devices external to the first circuitry wherein the first circuitry is clocked with a first clock and the circuitry that interfaces to devices external to the core is clocked with a second clock, the frequency of the first clock and the second clock being controllable. The method comprises loading a control location with a first value that controls the frequency of the first clock; loading a control location with a second control value that controls the frequency of the second clock; providing a new value for at least one of the first clock and the second clock; waiting until a defined time relative to the period of the second clock while holding the state of the first clock; and loading the new value in a control location at the defined time.

In yet a further aspect, this method is used in a battery operated electronic device and the new value is provided for the first clock to place the electronic device in a power saving mode.

Further, the value stored in the control location can be replaced with the first value to take the electronic device out of power saving mode.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
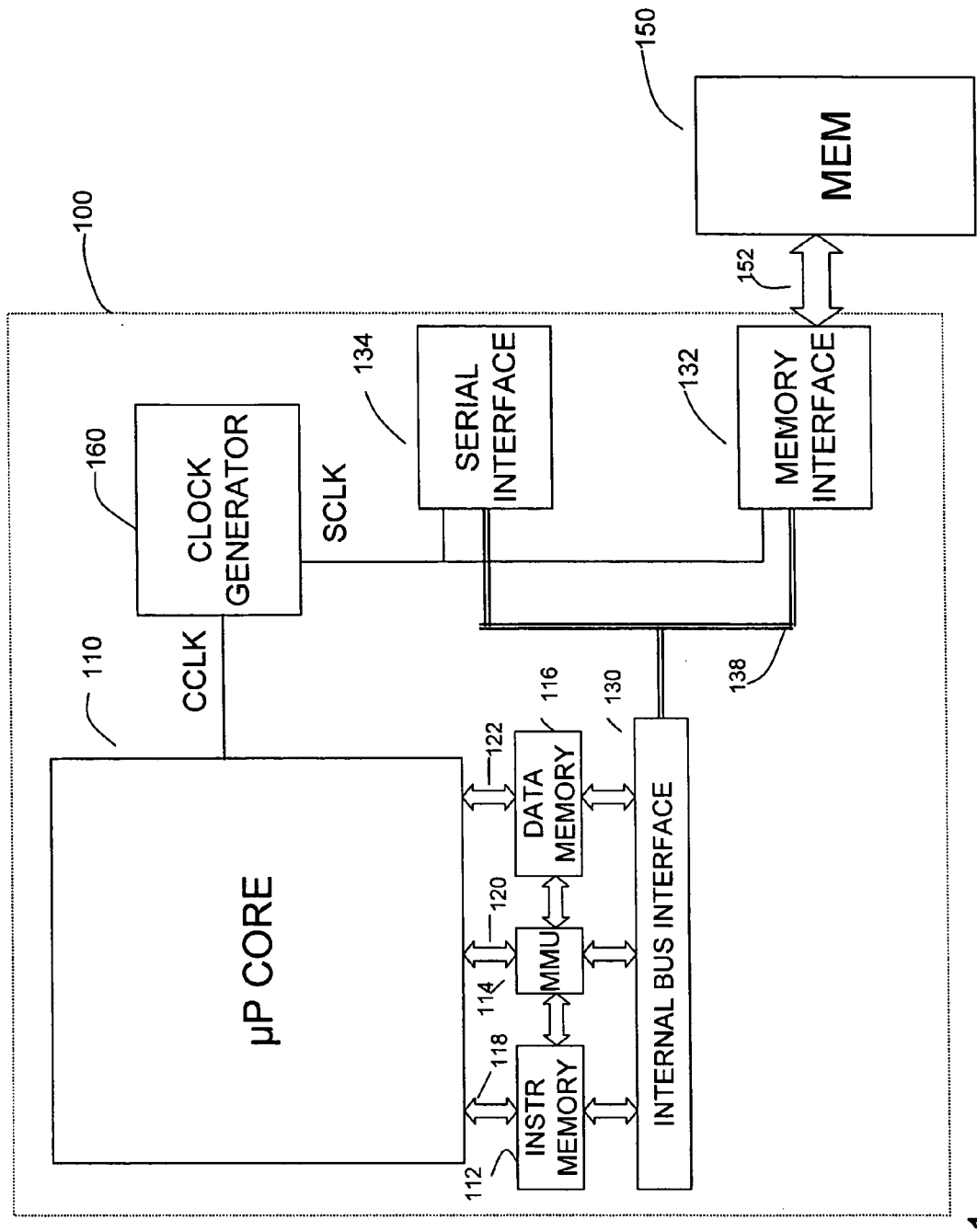
FIG. 1 is a block diagram of a prior art electronic system containing a data processing chip.

This invention is not limited in its application to the details of construction and the arrangement of components set forth in the following description or illustrated in the drawings. The invention is capable of other embodiments and of being practiced or of being carried out in various ways. Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

Figure 2:
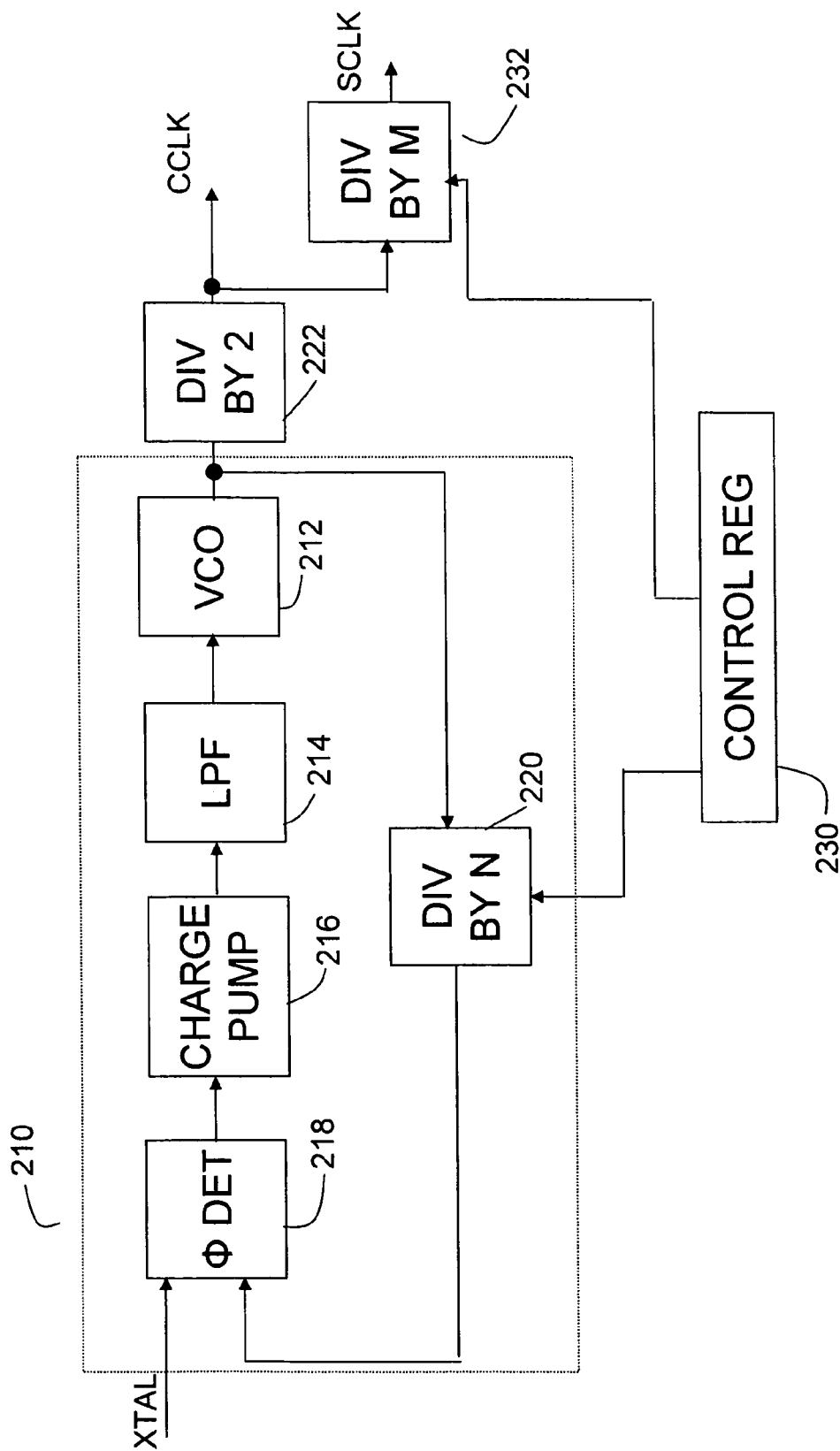
FIG. 2 is a block diagram of circuitry used to generate clocks for the data processing system of FIG. 1.

In accordance with the prior art, FIG. 2 shows in block diagram form circuitry that can be contained within clock generator 160. The circuit of FIG. 2 generates a CCLK signal and an SCLK signal. The circuitry of FIG. 2 uses a phased locked loop (PLL) 210 to generate the CCLK signal. Phase locked loop 210 includes a voltage controlled oscillator (VCO) 212.

The output of VCO 212 is provided to a frequency scaling circuit. Preferably, the frequency scaling circuit is programmable such that the ratio between the frequency of its input and its output can be programmed. A common form of frequency scaling circuit is a programmable divider. A programmed divider value can be stored in the programmable divider. The frequency of the output of the divider is less than the frequency of the input by the programmed divider value. Herein programmable counters will be used as an example of frequency scaling circuits.

In PLL 210, the frequency scaling circuit is implemented as divide-by-N counter 220. The value of N is programmable and can be set by a value written into control register 230.

The output of divide-by-N counter 220 is provided to a phase detector 218. The second input (XTAL) of phase detector 218 is obtained from an oscillator, such as a crystal oscillator. The input signal may be derived directly from the crystal or might be divided down in frequency before application to the phase locked loop. Phase detector 218 compares the output of divide-by-N counter 220 with the XTAL signal. When the two signals are aligned in frequency and phase the output of phase detector 218 is zero. In this condition, the phase locked loop is said to be "locked".

The locked condition occurs when the VCO 212 is producing an output that has frequency N times the frequency of the XTAL signal. Because the value of N can be changed by values written into control register 230, PLL 210 can be used to produce a stable clock of a controllable frequency.

The output of phase detector 218 is used in a negative feedback loop to drive VCO 212 to the locked condition. The output of phase detector 218 is provided to charge pump 216. Charge pump 216 produces a control voltage. The output of charge pump 216 is filtered by low pass filter 214 and then applied as a control input to VCO 212. VCO 212 changes its phase and frequency of oscillation in response to the value of the control input. When the loop is not locked, the output of phase detector 218 creates a control signal that eventually drives VCO 212 to oscillate at a frequency at which the loop locks.

In the embodiment of FIG. 2, the output of phase locked loop 210 is provided to a divide-by-2 counter 222. Divide-by-2 counter 222 is an optional element that aids in providing an output CCLK signal with a 50% duty cycle. When divide-by-2 counter 222 is used, phase locked loop 210 should be controlled to oscillate at a frequency that is twice the required frequency of the CCLK signal.

A lower frequency, synchronized clock, SCLK, is generated from the CCLK signal. For this purpose, the CCLK signal is provided to a frequency scaling circuit. Divide-by-M counter 232 is used as an example of a frequency scaling circuit. The value M in divide-by-M counter 232 can be programmed by values written into control register 230. By generating the SCLK signal from the CCLK signal, the SCLK signal will be synchronous with the CCLK signal. Having synchronous clock signals is useful in a microprocessor chip 110 in which some circuitry clocked by the CCLK signal exchanges data with circuitry clocked by the SCLK signal.

We have recognized that clock generation in a computer data processing chip can be improved. Even though divide-by-N counter 220 allows the frequency of the CCLK signal to be controlled, changing the frequency of the CCLK signal must be done carefully. When the programmable divider value N is changed, phase locked loop 210 is temporarily caused to be out of lock. Phase locked loop 210 will generally return to a locked condition some time after the value in N is changed. However, there will be a period of time during which the output of phase locked loop 210 will not be stable and will not have a known frequency.

To avoid problems associated with clocking a data processor with an unstable clock, operation of data processing chip 100 is often suspended after the change of the value of N until the phase locked loop 210 returns to a locked condition. Because of this disruption in the operation of data processing chip 100, the frequency of the CCLK signal is generally changed only when operation at the new frequency is likely to be required for an extended period of time.

One situation in which frequent changes of the CCLK frequency are desired is when data processing chip 100 is used in connection with a cell phone or other portable electronic device. In many portable electronic devices, the power dissipated by the device depends on the operating frequency of the digital circuitry in the device. The CCLK signal controls the operating frequency of much digital circuitry and therefore influences the amount of power used by the device at a given time.

To save power and conserve the life of batteries providing power to the processor chip 100, it would be desirable to reduce the frequency of the CCLK signal whenever there is not an immediate need for data processing operations performed at a high frequency. We have recognized that the data processing chip 100 could be improved if the frequency of the CCLK signal could be changed without the need to wait for the phase lock loop 210 to settle or re-synchronize.

We have also recognized that the circuitry of FIG. 2 requires that the frequency of the SCLK signal be an integer multiple of the frequency CCLK. This multiple is specified by the value M stored in divide-by-M counter 232. In some applications, particularly when data processing chip 100 performs digital signal processing functions, greater flexibility to independently set the frequencies of the CCLK and SCLK signals is an advantage. For example, the frequency of the CCLK signal is preferably set based on the frequency at which digital signal processing operations are performed. In contrast, the frequency of the SCLK signal is preferably set based on the type of circuitry to which data processing chip 100 is interfaced.

Figure 3:
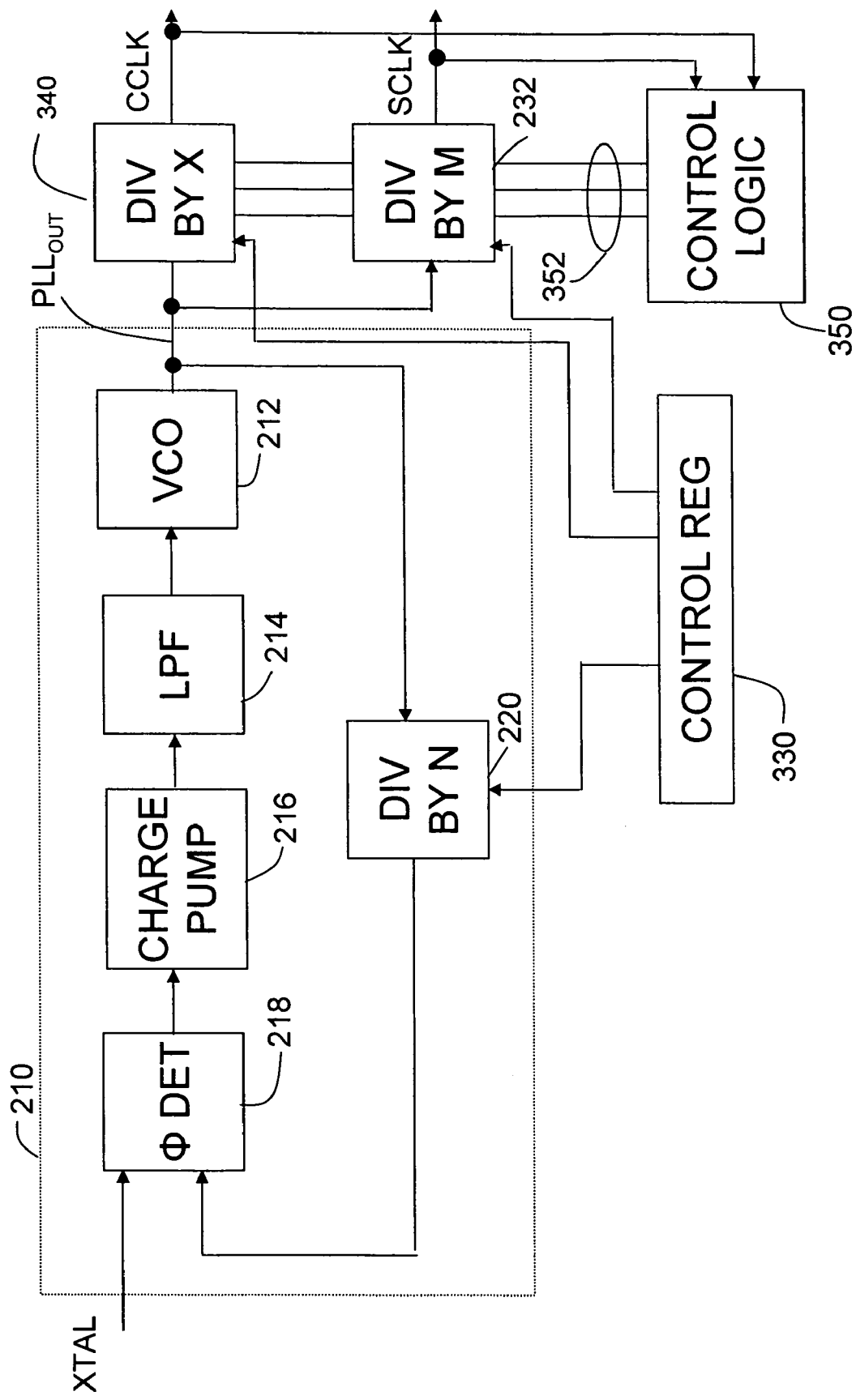
FIG. 3 is a block diagram of improved timing circuitry.

FIG. 3 shows improved clock generation circuitry that allows the frequency of the CCLK signal to be changed, even for relatively short periods of time. The circuitry of FIG. 3 also provides independent control over the frequencies of the CCLK and SCLK signals. The clock generation of FIG. 3 contains a phase locked loop 210. PLL 210 produces an output signal used as a reference clock from which other clock signals, such as CCLK and SCLK, might be generated.

However, the final output frequency of the CCLK signal is specified by a frequency conversion circuit connected to the reference clock. Divide-by-X counter 340 is used as an example of a frequency scaling circuit. Divide-by-X counter 340 divides down the frequency of the $PLL_{OUT}$ signal.

The frequency of the SCLK signal is controlled by divide-by-M counter 232. In contrast with the prior art, divide-by-M counter 232 does not receive as its input the CCLK signal. Rather, the input of divide-by-M counter 232 is derived directly from the output of phase locked loop 210.

The circuitry of FIG. 3 provides independent control over the frequencies of the CCLK and SCLK signals, relative to the VCO outuput. The frequency of the CCLK signal can be changed by changing the value of X stored in programmable divide-by-X counter 340. Changing the value of X has no impact on the frequency of the SCLK signal. Conversely the frequency of the SCLK signal can be changed by changing the value of M stored in divide-by-M counter 232. Changing the value of M has no impact on the frequency of the CCLK signal.

Further, the frequency of the CCLK signal can be changed without changing the value of N stored in divide-by-N counter 220. This capability allows the frequency of the CCLK signal to be changed "on the fly". Changing "on the fly" implies that the change can be made while data processor 100 is in operation, without a significant pause to make the change. Changing the CCLK signal frequency is useful to provide expanded power saving modes for data processing chip 100.

The circuitry of FIG. 3 also provides an ability to save power by reducing the value of N in divide-by-N counter 220. This change will reduce the frequency of both the CCLK and SCLK signals. However, as in the prior art, changing the value of N within phase locked loop 210 requires a period of time to resynchronize the phase lock loop 210. Time to resynchronize the phase locked loop is required both when the value of N is reduced to place the data processing chip 100 in a power saving mode and also when the value of N is restored (increased) to take data processing chip 100 out of power saving mode. Therefore, changing N to save power might be used only when full speed operation of the electronic device is not required for an extended period of time. For example, if data processing chip 100 is used in a cell phone, this power savings mode might be used to place the phone in a "standby mode" when it is not actively being used for a telephone call. If this type of standby mode were used during a call when no data needs processing, the time required for the loop to stabilize when new data needs processing might produce a noticeable data processing delay.

An additional power savings mode can be obtained by controlling the operating frequency of data processing chip 100 by changing the values in control register 330 that change the values of X and M in counters 232 and 340. Changing X and M does not require time for PLL 210 to stabilize. Accordingly, this mode might be used at any time there is no immediate need to use the processor at full speed. Thus, during a call, between packets of data, the frequency of the CCLK signal might be reduced to save power.

A further power saving mode is possible by using both modes together. For example, the values of X and M could large while N is made small.

In a preferred embodiment, the timing of the loading of values into counters 232 and 340 is controlled to prevent conditions in the CCLK or SCLK signals that could cause improper operation of the digital circuitry clocked by these clocks. Jitter in clock pulses or pulses that are too short to allow the digital circuitry to respond properly can produce an error condition.

To avoid these possible conditions, clock generator 160 includes control logic 350. Control logic 350 generates control signals 352 that run to divide-by-M counter 232 and divide-by-X counter 340. (This is not intended to require that counters 232 and 340 receive exactly the same control signals 352.) Control signals 352 control traditional counter functions as loading a valve of X or M into the counter, resetting the counter or enabling the counter to count clock pulses. When not enabled to count, each of counters 232 and 340 holds its output. Logic circuit 350 generates values of control signals 352 that cause the timing system to operate according to the timing diagrams shown in FIGS. 4A...4C.

Figure 4A:
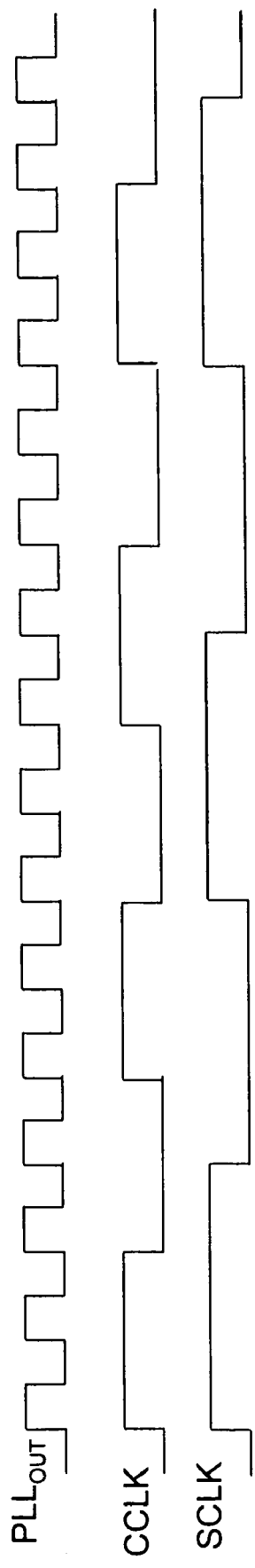
FIG. 4A is a timing diagram showing the relationship of signals in FIG. 3.

The first line of the timing diagram of FIG. 4A shows the signal $PLL_{OUT}$ at the output of the PLL 210 shown in FIG. 3.

The second line of the timing diagram of FIG. 4A shows the signal CCLK. In the example of FIG. 4A, each period of the CCLK signal spans four periods of the $PLL_{OUT}$ signal. This condition corresponds to a value of four loaded as the value of X in counter 340.

The third line of the timing diagram of FIG. 4A shows the signal SCLK. In the example of FIG. 4A, each period of the SCLK signal spans six periods of the $PLL_{OUT}$ signal. This condition corresponds to a value of six loaded as the value of M in counter 232.

Figure 4B:
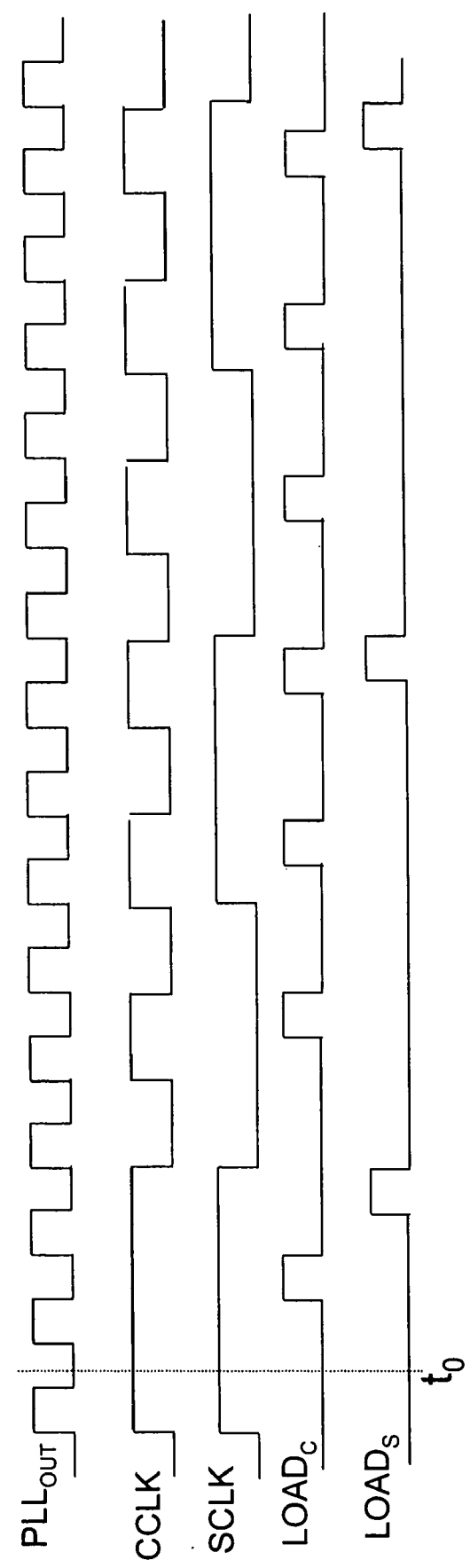
FIG. 4B is a timing diagram illustrating the relationship of signals in FIG. 3.

In the example of FIG. 4A, the periods of the CCLK and SCLK signals remain constant. In contrast, FIG. 4B illustrates a condition in which the frequency of the CCLK signal changes. In this example, the value in control register 330 is changed at time $t_0$. To avoid error conditions associated with clock pulses that are too short, limitations are placed on the process of changing the values in the counters. First, a new value of X is not loaded into divide-by-X counter 340 until the falling edge of the signal $LOAD_C$. $LOAD_C$ represents a timing signal that might, for example, be output by divide-by-X counter 340 as it reaches its terminal value. As can be seen in FIG. 4B, the falling edge of the signal $LOAD_C$ occurs at the end of each pulse of the CCLK signal, after a first falling edge of the CCLK signal has passed. This timing ensures that no pulse of the CCLK signal is cut short by changing the value of X in divide-by-X counter during a CCLK signal pulse.

Further, once the new value of X is loaded into divide-by-X counter 340, counter 340 is not reset until a defined point in the SCLK signal. Rather, counting is disabled so that the CCLK signal holds its state until the SCLK signal reaches this defined point.

In the illustrated example, that defined state of the SCLK signal is indicated by the signal $LOAD_S$. The $LOAD_S$ signal represents a timing signal that might, for example, be output by divide-by-M counter 232 as it reaches its terminal value. The falling edge of the signal $LOAD_S$ indicates that the SCLK signal is starting a new period.

Resetting divide-by-X counter 340 on the falling edge of the $LOAD_S$ signal synchronizes the CCLK and SCLK signals because both will start a new period at the same time.

While the CCLK signal is holding its state, digital logic controlled by the CCLK signal is not being clocked. However, the CCLK signal holds its state for an interval that is shorter than the period of the SCLK signal. Operation of the digital logic will resume after only a very short interval. This interval is shorter than the time it would take for PLL 210 to lock after the value of N is changed. Accordingly, the period of the CCLK signal can be said to be changed "on the fly."

Figure 4C:
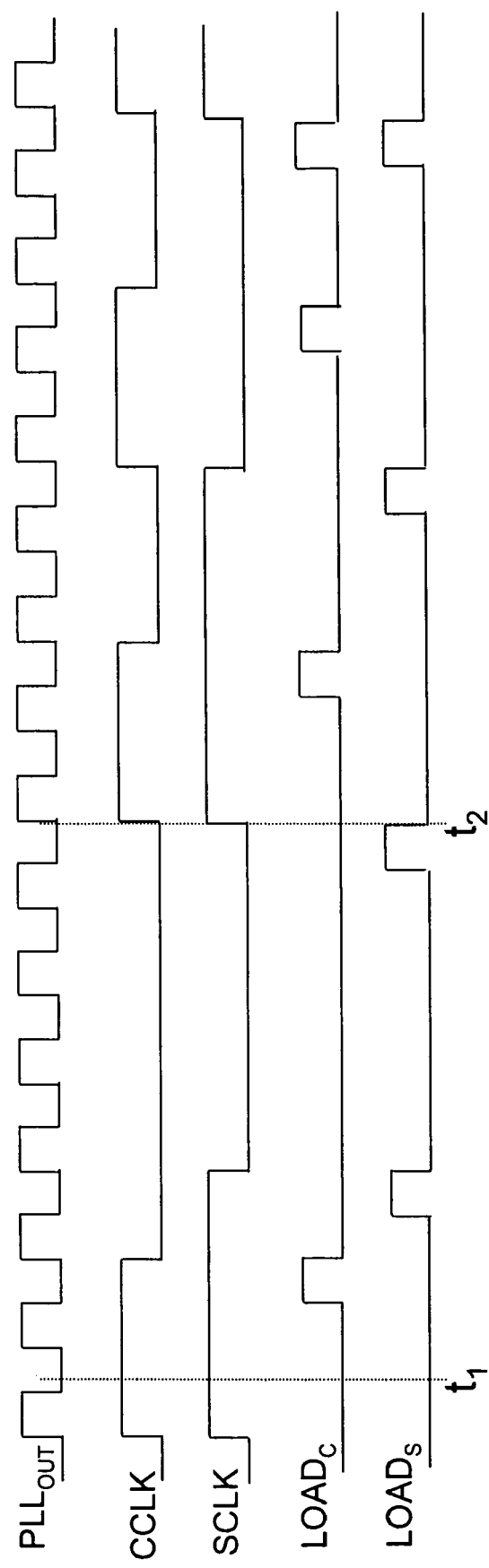
FIG. 4C is a timing diagram illustrating the relationship of signals in the timing circuit of FIG. 3.

Similar timing is employed when the value in divide-by-M counter 232 is changed to change the period of the SCLK signal. An example of this timing is shown in FIG. 4C. In this example, a command to change the value of M in divide-by-M counter 232 is given at time $t_1$. For example, this command might be given by loading a new value into control register 330.

A new value of M is not loaded into divide-by-M counter 232 until the end of the current period of the SCLK signal. Imposing this restriction avoids spurious pulses in the SCLK signal that might occur if the value of M were changed during a period. The end of the period of the SCLK signal is indicated by the falling edge of the signal LOADS. The value of M is loaded and the count value in the counter is reset on the falling edge of the $LOAD_S$ signal.

To maintain synchronization between the CCLK and SCLK signals, the value of the CCLK signal holds it state until a time when the CCLK and SCLK signals can be synchronized. In FIG. 4C, the SCLK signal undergoes a transition at time $t_2$. At time $t_2$, the CCLK signal stops holding its value the CCLK and SCLK signals begin to oscillate in unison. Because the CCLK and SCLK signals oscillate at different frequencies, subsequent clock pulses will not necessarily be coincident. However, the clocks are said to be synchronized because they start out with a defined time relationship.

In the example of FIG. 4C, both the SCLK and CCLK signals undergo a low to high transition at time $t_2$. If the CCLK signals were holding its state at a high level, the CCLK signals could be re-enabled at the next high to low transition of the SCLK signal. In this way, the CCLK and SCLK signals would start off at the same time with the same polarity.

In most digital processors, it will be important that neither clock output a pulse with a width so short that it represents an invalid timing signal for the digital logic timed by that pulse. In the illustrated embodiment, this condition is avoided by only changing values that control the length of a pulse at the end of a full period of a first clock and holding the state of the second clock until another transition of the first clock. So long as the period of the second clock is longer than the minimum allowed period of the first clock, neither clock will output a pulse that is so short it violates the timing requirements of the digital processor system.

If the period of the second clock could be shorter than the minimum allowed period of the first clock, an alternative embodiment is possible under which the state of the first clock is held for multiple cycles of the second clock. Whatever number of cycles is selected should result in a delay that is longer than the minimum allowed width of a pulse of the first clock.

The circuit of FIG. 3 (and the methodology it practices) provides several advantages. One advantage is that there is no jitter in the clocks even as the timing is changed on the fly. A further advantage is that the timings for critical logic and interface logic can be controlled independently.

Having thus described several aspects of at least one embodiment of this invention, it is to be appreciated various alterations, modifications, and improvements will readily occur to those skilled in the art.

For example, in the illustrated embodiments, frequency scaling circuits are implemented as programmable counters. These examples should not be taken to imply that the frequency scaling circuit must be a counter or a divider. Nor should it be inferred that the frequency scaling circuit must be implemented to provide an output frequency that is an integer sub-multiple of the input frequency. For example, non-integer frequency multiples can often be implemented by using a frequency multiplier circuit in series with a frequency divider circuit.

Also, it was described that upon resetting either the divide by X counter 340 or the divide-by-M counter 232, the CCLK signal holds its value until synchronized with the SCLK signal. It is possible that the SCLK signal could hold its value until the CCLK and SCLK signals are synchronized. However, the CCLK signal will typically have a shorter period than the SCLK signal. If the CCLK signal has a period that is shorter than the minimum valid period of the SCLK signal, resetting the SCLK signal in coordination with the CCLK signal could result in a spurious output pulse from the SCLK signal. Further, because the SCLK signal is used to clock circuits that interface with external devices, it is usually preferable that these interface circuits not stop operating even if the clock frequency is changed. However, where holding the SCLK signal is acceptable, additional alterations are possible. Further, the end of a clock period is illustrated as the falling edge of the clock. Any point in a periodic signal can be taken as the end of a period. In practice, a convenient point will be selected as the end of the period. Preferably, through, an edge of the signal, either a rising edge or talking edge will be used.

Further, variations can be made in relative timing of signals. For example, the illustrated embodiment shows each transition of the CCLK and SCLK signals aligned with a rising edge of the reference clock generated by the phase locked loop. Such timing is not critical to the invention. These signals might be synchronized to the falling edge of the reference clock, or timed in any other convenient manner.

Such alterations, modifications, and improvements are intended to be part of this disclosure, and are intended to be within the spirit and scope of the invention. Accordingly, the foregoing description and drawings are by way of example only.

What is claimed is:

1. A semiconductor chip comprising a clock generation circuit, the clock generation circuit comprising:
    a) a phase locked loop having an output;
    b) a first programmable frequency scaling circuit having an input and an output, the input being coupled to the output of the phase locked loop, and the output of the first programmable frequency scaling circuit providing a first clock signal, the first programmable frequency scaling circuit comprising a first programmable divider;
    c) a second programmable frequency scaling circuit having an input and an output, the input being coupled to the output of the phase locked loop, and the output of the second programmable frequency scaling circuit supplying a second clock signal, the second programmable frequency scaling circuit comprising a second programmable divider;
    d) at least one control register, said at least one control register having a field specifying a scale factor of the first frequency scaling circuit and a field specifying a scale factor of the second frequency scaling circuit;
    e) internal circuitry clocked by the first clock signal;
    f) at least one interface circuit clocked by the second clock signal, the interface circuit adapted to interface to external circuitry; and
    g) control logic providing control signals to the first programmable divider and the second programmable divider.

2. The semiconductor chip of claim 1, wherein the first programmable divider is a first programmable counter and the second programmable divider is a second programmable counter.

3. The semiconductor chip of claim 1, wherein the control logic provides to the first programmable divider a control signal controlling the loading of a programmed divider value when the control logic detects an end of a period of the first clock.

4. The semiconductor chip of claim 3 wherein the first programmable divider stores a programmable divider value and upon loading a Previously Presented programmed divider value in the first programmable divider, the control logic generates an enable control signal to the first programmable divider causing the first programmable divider to hold its output until the second clock reaches a transition.

5. The semiconductor chip of claim 1, wherein the phase locked loop additionally comprises a third programmable divider.

6. A method of operating a data processing chip, the method comprising:
    a) providing a reference clock;
    b) specifying a first frequency ratio between a first clock and the reference clock;
    c) deriving the first clock from the reference clock with the first frequency ratio;
    d) specifying a second frequency ratio between a second clock and the reference clock, the second frequency ratio specified independent of the first frequency ratio;
    e) deriving the second clock from the reference clock with the second frequency ratio;
    f) clocking first circuitry with the first clock and clocking second circuitry with the second clock; and
    g) changing the frequency of the first clock on the fly;
    h) wherein clocking the first circuitry with the first clock and clocking the second circuitry with the second clock comprises clocking circuitry internal to the data processing chip with the first clock and clocking circuitry interfacing to circuitry external to the data processing chip with the second clock.

7. A method of operating a data processing chip, the method comprising:
    a) providing a reference clock;
    b) specifying a first frequency ratio between a first clock and the reference clock;
    c) deriving the first clock from the reference clock with the first frequency ratio;
    d) specifying a second frequency ratio between a second clock and the reference clock, the second frequency ratio specified independent of the first frequency ratio;
    e) deriving the second clock from the reference clock with the second frequency ratio;
    f) clocking first circuitry with the first clock and clocking second circuitry with the second clock; and
    g) placing the data processing chip in a first power saving mode by changing the first frequency ratio such that the first circuitry is clocked at a lower rate.

8. The method of operating a data processing chip of claim 7 additionally comprising placing the data processing chip in a second power saving mode by reducing the frequency of the reference clock.

9. The method of operating a data processing chip of claim 7 wherein the data processing chip processes data in a mobile telephone and placing the data processing chip in a first power saving mode occurs while a call is in process on the mobile telephone.

10. The method of operating a data processing chip of claim 8 wherein the data processing chip is inside a mobile telephone and placing the data processing chip in a second power saving mode occurs while the mobile telephone is not in use to make a call.

11. The method of operating a data processing chip of claim 6 additionally comprising placing the data processing chip in a first power saving mode by changing the first frequency ratio such that the first circuitry is clocked at a lower rate without changing the frequency of the reference clock or the second clock.

12. The method of operating a data processing chip of claim 6 wherein the frequency of the first clock and the frequency of the second clock are not integer multiples of each other.

13. The method of operating a data processing chip of claim 6 wherein the data processing chip comprises at least one control register with a field specifying a frequency ratio between the reference clock and the first clock and a field specifying a frequency ratio between the reference clock and the second clock.

14. A method of operating a data processing chip having first circuitry and circuitry that interfaces to devices external to the first circuitry wherein the first circuitry is clocked with a first clock and the circuitry that interfaces to devices external to the first circuitry is clocked with a second clock, the frequency of the first clock and the second clock being controllable, the method comprising:
   a) loading a control location with a first value that controls the frequency of the first clock;
   b) loading a control location with a second control value that controls the frequency of the second clock;
   c) providing a new value for at least one of the first clock and the second clock;
   d) waiting until a defined time relative to the period of the second clock while holding the state of the first clock; and
   e) loading the new value in a control location at the defined time.

15. The method of claim 14 wherein the second clock operates at a slower frequency than the first clock.

16. The method of claim 15 wherein the data processing chip processes data in a mobile telephone and providing a new value for one of the first clock and the second clock comprises providing a new value for the first clock while a call is in process on the mobile telephone.

17. The method of claim 14 wherein providing the new value for one of the first clock and the second clock comprises setting a value in a control register.

18. The method of claim 17 wherein loading a control location comprises loading a programmable counter.

19. The method of claim 14 wherein the act c) of providing a new value-comprises providing a new value for the first clock to place a battery operated electronic device in a power saving mode.

20. The method of claim 19 additionally comprising replacing the new value stored in the control location with the first value to take the electronic device out of power saving mode.

21. The method of operating a data processing chip of claim 7 wherein the frequency of the first clock and the frequency of the second clock are not integer multiples of each other.

22. The method of operating a data processing chip of claim 7 wherein the data processing chip comprises at least one control register with a field specifying a scale factor of the first frequency scaling circuit and a field specifying a scale factor of the second frequency scaling circuit.

23. The method of claim 7 wherein clocking the first circuitry with the first clock and clocking the second circuitry with the second clock comprises clocking circuitry internal to the data processing chip with the first clock and clocking circuitry interfacing to circuitry external to the data processing chip with the second clock.

* * * * *